United States Patent [19]

Motai et al.

[11] Patent Number: 5,005,056
[45] Date of Patent: Apr. 2, 1991

[54] AMORPHOUS-SILICON THIN FILM TRANSISTOR ARRAY SUBSTRATE

[75] Inventors: Noboru Motai, Tochigi; Sakae Tanaka; Yoshiaki Watanabe, both of Tokyo, all of Japan

[73] Assignees: Nippon Precision Circuits Ltd.; Seikosha Co., Ltd., both of Tokyo, Japan

[21] Appl. No.: 306,373

[22] Filed: Feb. 3, 1989

[30] Foreign Application Priority Data

Feb. 26, 1988 [JP] Japan .................................. 63-43577

[51] Int. Cl.⁵ .......................................... H01L 45/00
[52] U.S. Cl. .......................................... 357/2; 357/4; 357/41; 357/45; 357/59; 357/71
[58] Field of Search .................. 357/2, 4, 41, 45, 59, 357/71

[56] References Cited

U.S. PATENT DOCUMENTS

4,803,528  2/1989  Pankove ................................ 357/2

Primary Examiner—Edward J. Wojciechowicz
Attorney, Agent, or Firm—Jordan and Hamburg

[57] ABSTRACT

A reverse staggered amorphous-silicon thin film transistor array substrate includes amorphous silicon thin film transistors in an array, gate wirings interconnecting the gate electrodes of the transistors, and source wirings of a transparent conductive layer connecting the source electrodes. An auxiliary source wiring of the material of the source electrodes of said transistors is provided under the source wiring.

7 Claims, 7 Drawing Sheets

AMORPHOUS-SILICON THIN FILM TRANSISTOR ARRAY SUBSTRATE

FIELD OF THE INVENTION

The present invention relates to the structure of an amorphous-silicon (hereinunder referred to as "a-Si") thin film transistor (hereinunder referred to as "TFT") array substrate.

BACKGROUND OF THE INVENTION

Liquid crystal matrix displays, in particular, active matrix type liquid crystal displays provided with a switching element for each picture element have recently been researched and developed in many institutes for use in thin picture displays. A TFT of a MIS type is generally utilized in these displays.

Figure 7:
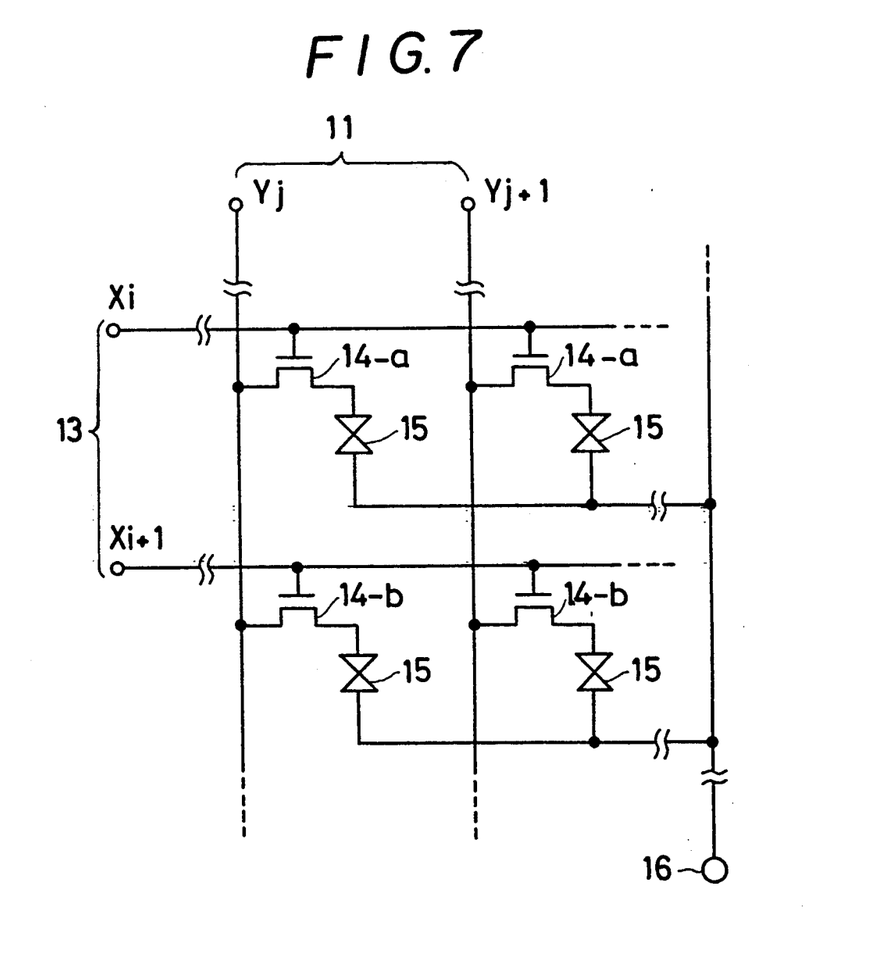
FIG. 7 is an electrical circuit diagram showing the circuit wiring of an active matrix type liquid crystal display.

FIG. 7 schematically shows an example of the structure of an active matrix type liquid crystal display which uses a TFT. Reference numeral 14 represents a TFT, and 15 a liquid crystal layer for one pixel which is clamped between a pixel electrode (not shown) connected to the drain electrode of the TFT 14 and a counter electrode 16 provided on a substrate which opposes the substrate provided with the TFT through the liquid crystal layer. The reference numeral 13 represents a gate wiring for connecting the gate electrode of each TFT 14 and supplying a scanning signal which turns each TFT on and off for each line to the gate electrode of the TFT 14. Reference numeral 11 denotes a source wiring for connecting the source electrode of each TFT 14 and supplying a picture signal to the source electrode of each TFT 14 which is selected by the gate wiring 13. The principle of display by an active matrix type liquid crystal display will now be briefly explained with reference to FIG. 7. For example, when a select signal is applied to a signal terminal Xi in the gate wiring 13, all TFTs 14-a which are connected to the terminal Xi are turned on at once, and a picture signal is supplied from the signal terminal Yi, Yi+1, . . . of the source wiring 11 to the pixel electrode which is connected to the drain electrode through the source electrode of each TFT 14-a. The voltage of the pixel electrode and the voltage of the counter electrode 16 determine the voltages applied to the respective liquid crystal layers 15, and the determined voltages change the light transmittances of the respective liquid crystal layers to produce the display. When the signal applied to the signal terminal Xi assumes a non-selected state and each TFT connected to the Xi is turned off, a select signal is applied to the subsequent signal terminal Xi+1, and the same operation as the above is effected. The voltage applied to each liquid crystal layer 15 is retained due to the capacity component of the liquid crystal layer 15 itself even after the TFT 14 is turned off until the same TFT is turned on.

A reverse stagger type a-Si TFT in which a gate electrode is disposed on the layer under a gate insulation layer and a semiconductor layer and a source electrode and a drain electrode are disposed on the layer above the gate insulation layer and the semiconductor layer, is widely utilized for the TFT 14. A reverse stagger type a-Si TFT having a structure in which a gate insulation layer, an amorphous silicon layer and a protective insulation layer are subsequently formed in that order has been specifically proposed from the point of view of reliability and reproducibility.

Figure 8:
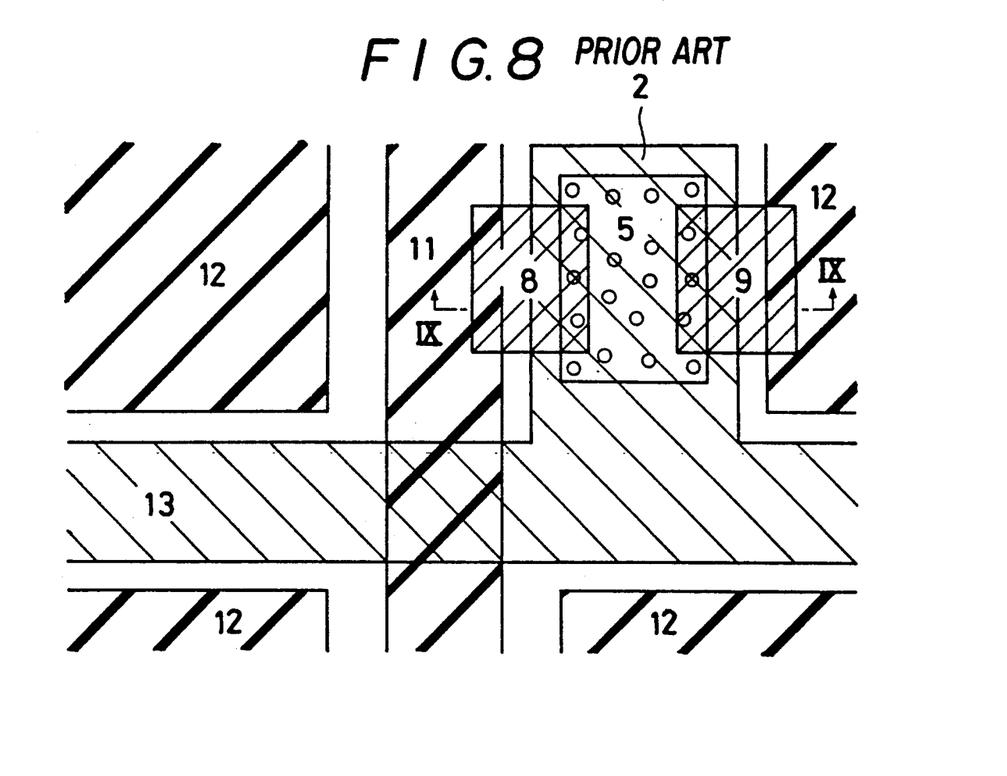
FIG. 8 is a partially cutaway elevational view of an example of the prior art.
Figure 9:
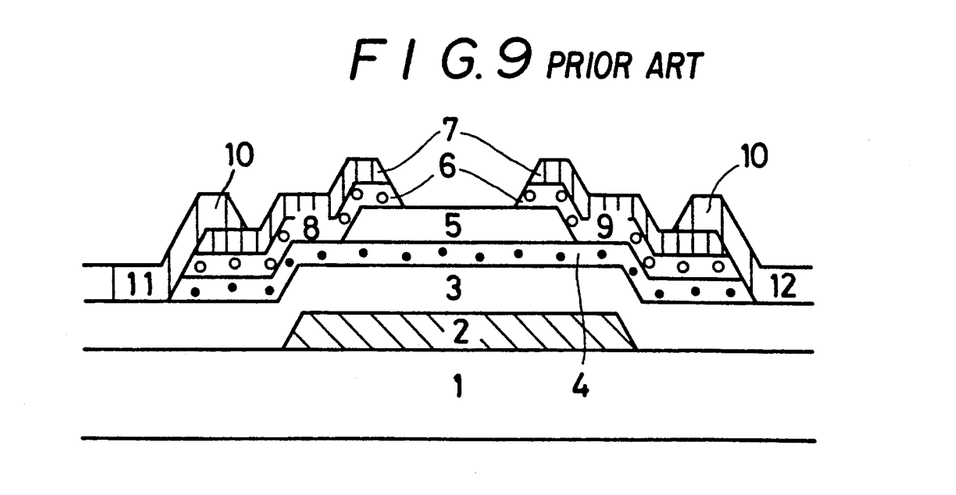
FIG. 9 is a sectional view of the example shown in FIG. 8, taken along the line IX—IX in FIG. 8.

FIGS. 8 and 9 represent an a-Si TFT having the above-described structure together with the gate wiring, the source wiring, the pixel electrode, etc. In FIGS. 8 and 9, reference numeral 1 represents an insulating substrate, 2 a gate wiring, 3 a gate insulation layer, 4 an amorphous silicon layer, 5 a protective insulation layer, 6 a silicon layer containing impurities aimed at ohmic contact in the source and the drain and the blocking of a hole, 7 a metal layer for forming a source electrode and a drain electrode, and 8 and 9 a source electrode and a drain electrode composed of the impurity silicon layer 6 and the metal layer 7. Reference numeral 10 represents a transparent conductive layer, 11 and 12 a source wiring and a pixel electrode composed of the transparent conductive layer, and 13 a gate wiring.

In an active matrix type liquid crystal display, since the width of the source wiring 11 is about 10 to 20 micrometers, disconnection on the source wiring 11 sometimes occurs when there is dust, the end portion of the gate wiring 13 at which there is a difference in level is crossed, or the like. When disconnection occurs, the defective conduction leads to a line defect on the display screen which greatly deteriorates the display quality. For the transparent conductive layer 10, an ITO is generally used, but it makes it difficult to form a fine pattern at the time of etching, which is one of the causes of disconnection.

As described above, since the source wiring 11 is conventionally formed only from the transparent conductive layer 10, disconnection is apt to occur, and it is considered to be one of the causes of defective conduction.

SUMMARY OF THE INVENTION

Accordingly, it is an object of the present invention to eliminate the above described problems and to ameliorate the lowering of the production yield caused by the defective conduction of the source wiring composed of the transparent conductive layer.

DESCRIPTION OF THE PREFERRED EMBODIMENTS

Figure 1:
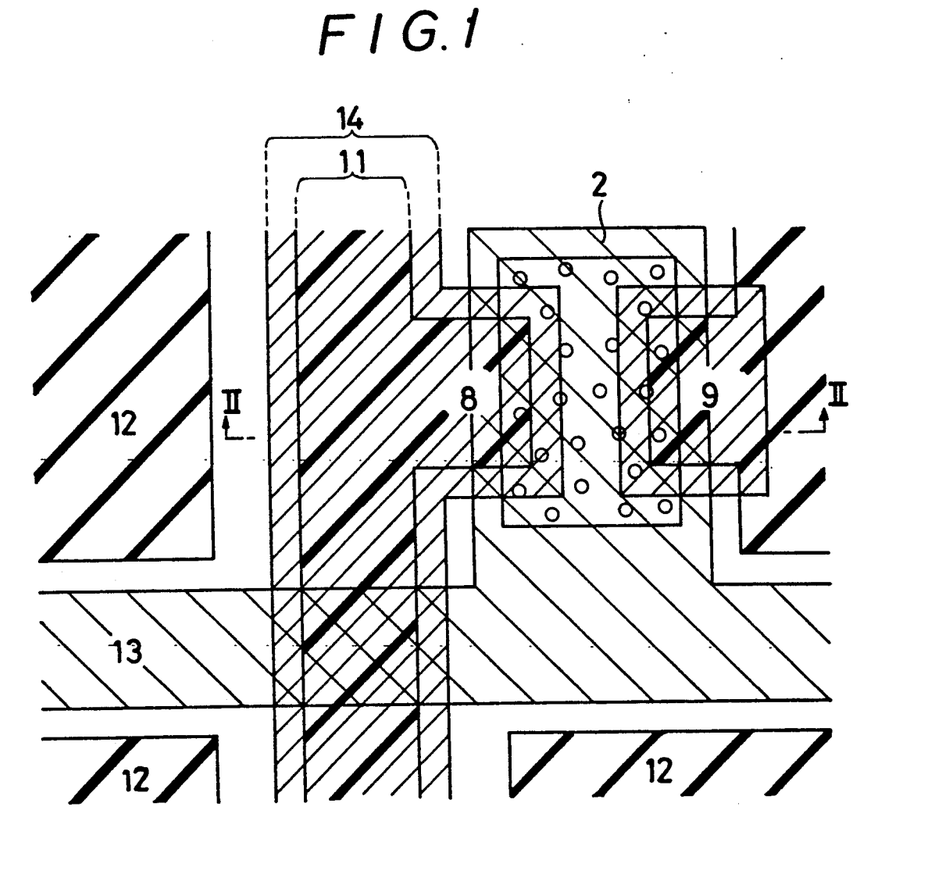
FIG. 1 is a partially cutaway elevational view of a first embodiment of the present invention.
Figure 2A:
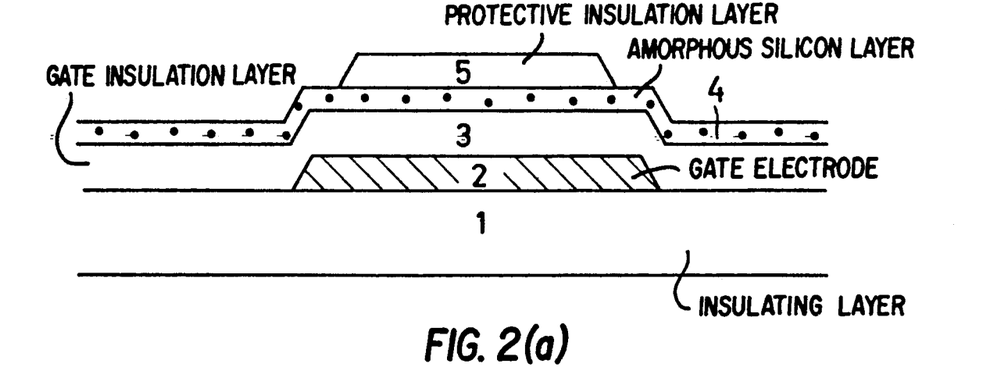
FIGS. 2(a)-2(c) are sectional views of the steps of the embodiment shown in FIG. 1, taken along the line II—II in FIG. 1.
Figure 2B:
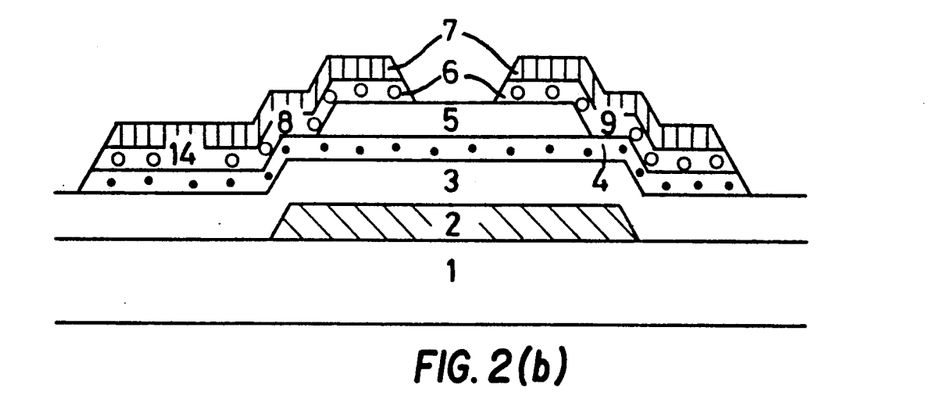
Figure 2C:
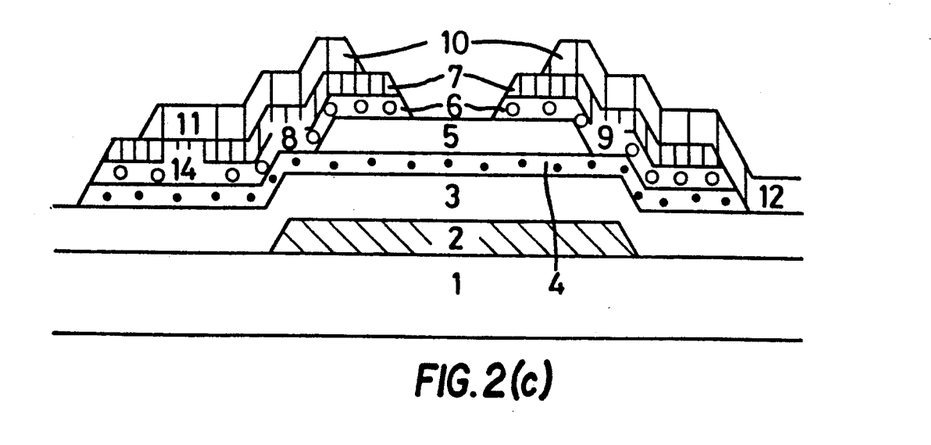

FIGS. 1 and 2 show a first embodiment of the present invention. In FIGS. 1 and 2, reference numeral 1 represents an insulating substrate, 2 a gate wiring, 3 a gate insulation layer, 4 an amorphous silicon layer, 5 a protective insulation layer, 6 an impurity silicon layer, 7 a metal layer, and 8 and 9 a source electrode and a drain electrode composed of the impurity silicon layer 6 and the metal layer 7. Reference numeral 10 represents a transparent conductive layer, 11 and 12 a source wiring and a pixel electrode composed of the transparent conductive layer, 13 a gate wiring, and 14 an auxiliary source wiring composed of the impurity silicon layer 6 and the metal layer 7, which are the materials of the source electrode.

The manufacturing steps will be explained hereinunder with reference to FIGS. 1 and 2(a)-2(c). FIGS. 2(a), 2(b) and 2(c) sequentially follow the manufacturing order.

In FIG. 2(a), the gate electrode 2 and the gate wiring 13 (not shown in FIG. 2(a)) are formed on the insulating substrate 1 of glass or the like, and the gate insulation layer 3, the amorphous silicon layer 4 and the protective insulation layer 5 are deposited thereon by plasma CVD. The protective insulation layer is selectively removed.

In FIG. 2(b), the impurity silicon layer 6 containing an appropriate amount of n-type impurities directed to the ohmic contact in the source and the drain portions and the blocking of a hole is deposited by plasma CVD, and subsequently Ti is deposited by vacuum deposition as the metal layer 7. The metal layer 7 is etched by a solution of weak fluoronitric acid and patterned into the patterns of the source electrode 8, the drain electrode 9 and the auxiliary source wiring 14. The impurity silicon layer 6 and the amorphous silicon layer 4 are etched by an organic alkali solution while using the pattern formed on the metal layer 7 and the pattern formed on the protective insulation layer 5 as a mask, thereby forming the source electrode 8 and the drain electrode 9 composed of the impurity silicon layer 6 and the metal layer 7 and the auxiliary source wiring 14 composed of the impurity silicon layer 6, the metal layer 7 and the like.

In FIG. 2(c), an ITO is deposited as the transparent conductive layer 10 by vacuum deposition, and etched by a ferric chloride solution to form the source wiring 11 and the pixel electrode 12. The source wiring 11 formed at this time has a smaller width than the auxiliary source wiring 11, as is clear from FIG. 2(c).

As a result of these steps, an a-Si TFT array substrate provided with the auxiliary source wiring 14 composed of the impurity silicon layer 6 and the metal layer 7, which are materials of the source electrode, under the source wiring 11 is completed, as shown in FIGS. 1 and 2(c).

Figure 3:
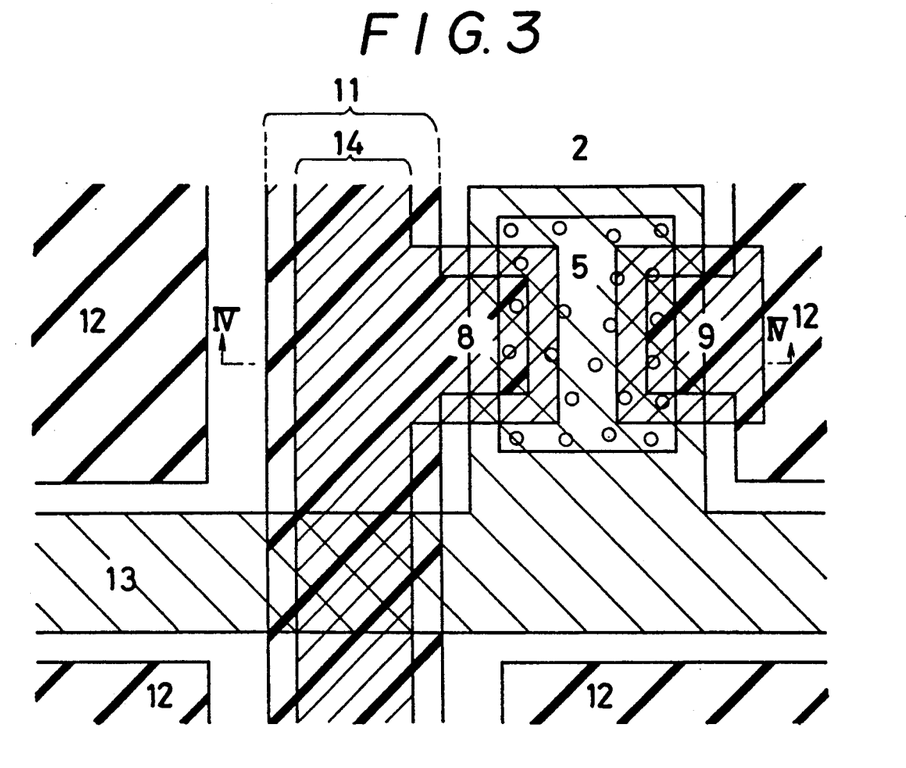
FIG. 3 is a partially cutaway elevational view of a second embodiment of the present invention.
Figure 4:
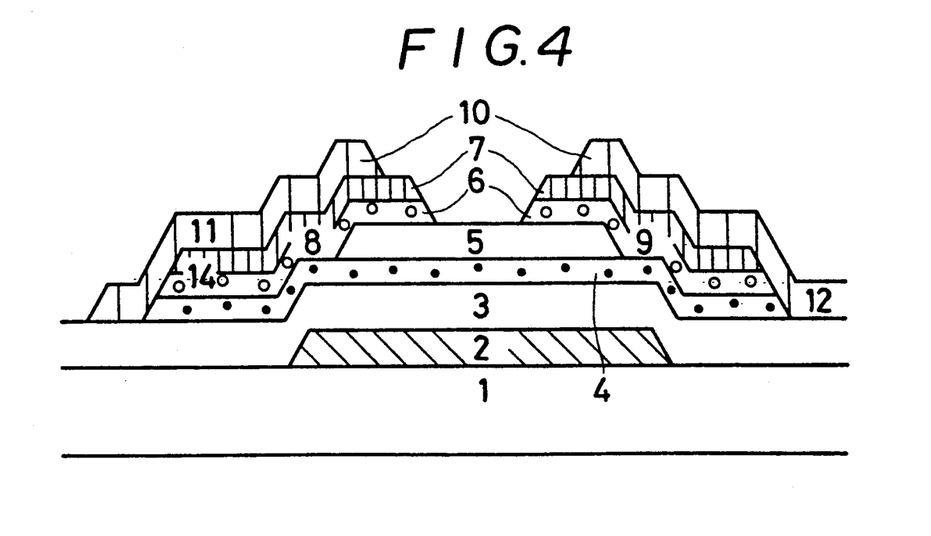
FIG. 4 is a sectional view of the embodiment shown in FIG. 3, taken along the line IV—IV in FIG. 3.

FIGS. 3 and 4 show a second embodiment of the present invention. The same numerals are provided for the elements which are the same as those in the first embodiment. This embodiment is almost the same as the first embodiment except that the source wiring 11 has a larger width than the auxiliary wiring 14.

Figure 5:
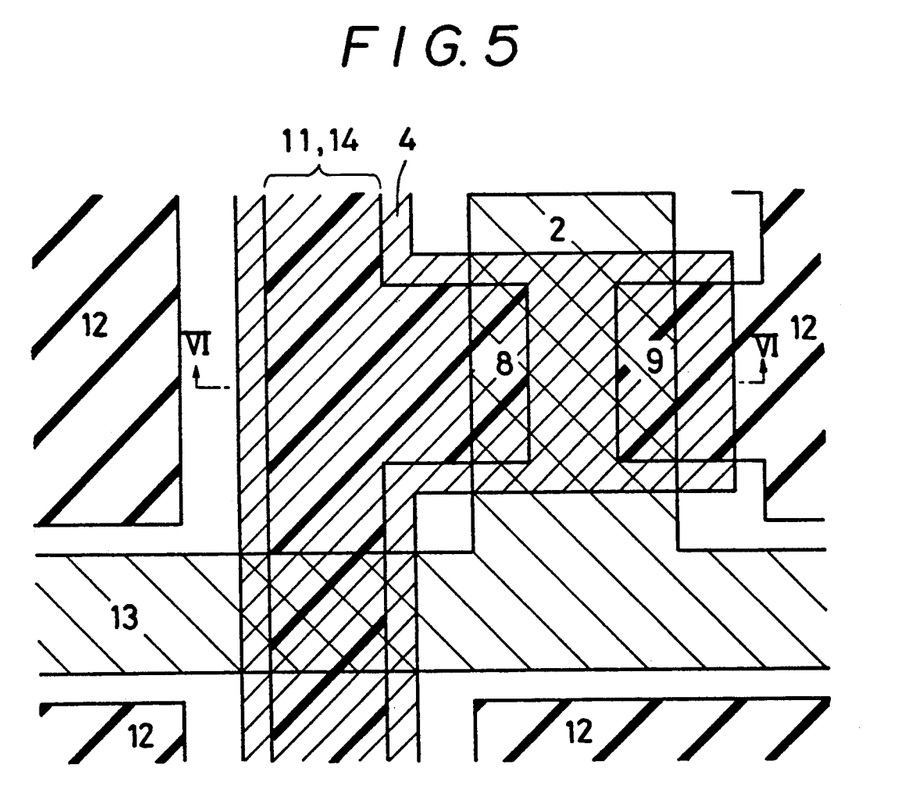
FIG. 5 is a partially cutaway elevational view of a third embodiment of the present invention.
Figure 6A:
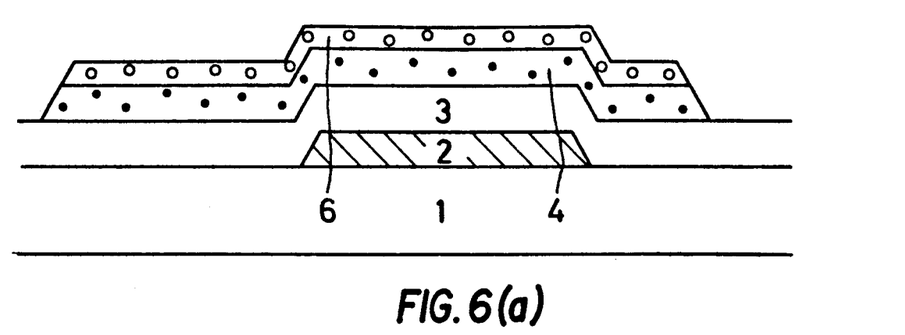
FIGS. 6(a)-6(c) are sectional views of the steps of the embodiment shown in FIG. 5, taken along the line VI—VI in FIG. 5.
Figure 6B:
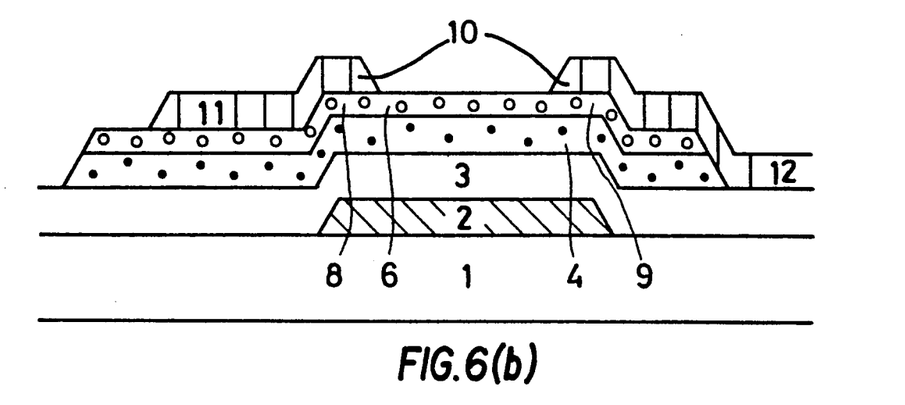
Figure 6C:
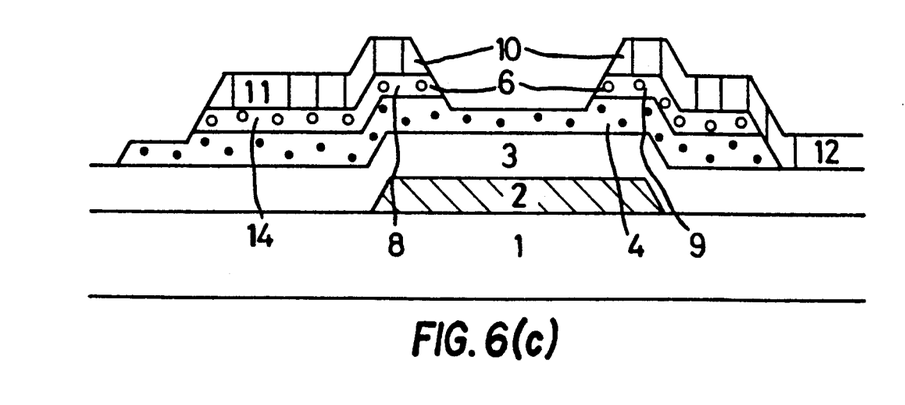

FIGS. 5 and 6 show a third embodiment of the present invention. In FIGS. 5 and 6, reference numeral 1 represents an insulating substrate of glass or the like, 2 a gate wiring, 3 a gate insulation layer, 4 an amorphous silicon layer, 6 an impurity silicon layer, and 8 and 9 a source electrode and a drain electrode composed of the impurity silicon layer 6. Reference numeral 10 represents a transparent conductive layer, 11 and 12 a source wiring and a pixel electrode composed of the transparent conductive layer, 13 a gate wiring, and 14 an auxiliary source wiring composed of the impurity silicon layer 6, which is the material of the source electrode.

The manufacturing steps will be explained hereinunder with reference to FIGS. 5 and 6. FIGS. 6(a), 6(b) and 6(c) sequentially follow the manufacturing order.

In FIG. 6(a), the gate electrode 2 and the gate wiring 13 (not shown in FIG. 6(a)) are formed on the insulating substrate 1 of glass or the like, and the gate insulation layer 3, the amorphous silicon layer 4 and the impurity silicon layer 6 are deposited thereon by plasma CVD. The amorphous silicon layer 4 and the impurity silicon layer 6 are plasma etched by using $CF_4$ gas so as to leave the two layers on the TFT portion and the source wiring portion.

In FIG. 6(b), an ITO is deposited as the transparent conductive layer 10 by vacuum deposition, and etched by a ferric chloride solution to form the patterns of the source electrode 8, the drain electrode 9, the source wiring 11 and the pixel electrode 12.

In FIG. 6(c), the impurity silicon layer 6 is plasma etched by using $CF_4$ gas while using the patterns formed by the transparent conductive layer 10 as a mask, thereby forming the source wiring 11, the pixel electrode 12, and the auxiliary source wiring 14 composed of the impurity silicon layer 6.

As a result of these steps, an a-Si TFT array substrate provided with the auxiliary source wiring composed of the impurity silicon layer 6, which is the material of the source electrode, under the source wiring 11 is completed, as shown in FIGS. 5 and 6(c).

In any of the above-described three embodiments, the auxiliary source wiring composed of the material of the source electrode is provided under the source wiring composed of the transparent conductive layer, so that even if disconnection is produced on the source wiring, the conduction of the source wiring is secured unless the auxiliary source wiring is broken at the same portion. When the defective conduction of the source wiring was actually measured, it was confirmed that the defective conduction was greatly ameliorated as compared with the prior art. Furthermore the present invention can be executed without adding any particular new step to the conventional steps, as is clear from the comparison between FIGS. 1 and 2 and FIGS. 8 and 9.

The present invention, in which the provision of the auxiliary source wiring under the source wiring greatly reduces the defective conduction, greatly contributes to the enhancement of the production yield.

We claim:

1. In a reverse staggered type amorphous-silicon thin film transistor array substrate including amorphous silicon thin film transistors provided in an array, gate electrodes, gate wirings interconnecting the gate electrodes of said amorphous silicon thin film transistors, source electrodes comprised at least of an impurity doped silicon layer, and first source wirings composed of a transparent conductive layer interconnecting the source electrodes of said transistors, the improvement wherein said amorphous silicon thin film transistor array substrate comprises an auxiliary source wiring extending under said first source wirings and interconnecting said source electrodes, said auxiliary wiring being formed with said source electrodes, whereby said auxiliary wirings are composed of the same material as the source electrode of at least one of said amorphous silicon thin film transistors.

2. In a reverse staggered type amorphous-silicon thin film transistor array substrate according to claim 1, wherein said material of the source electrode is a silicon layer containing impurities and a metal layer.

3. In a reverse staggered type amorphous-silicon thin film transistor array substrate according to claim 1, wherein said material of the source electrode is a silicon layer containing impurities.

4. A reverse staggered amorphous-silicon thin film transistor array substrate of amorphous silicon thin film transistors having gate electrodes and source electrodes, said source electrodes being comprised of an impurity doped silicon layer, said transistors being arranged in an array, comprising gate wirings interconnecting said gate electrodes, transparent conductive source wirings interconnecting said source electrodes, and auxiliary source wirings interconnecting said source electrodes, said auxiliary source wirings being formed along said transparent source wirings in it length direction and extending under said transparent source wirings, said auxiliary wirings being of the same material as said source electrodes.

5. The reverse staggered amorphous-silicon thin film transistor array substrate of claim 4 wherein said source electrodes further comprise a metal layer overlaying said impurity doped silicon layer and said auxiliary wirings are also comprised of an extension of said metal layer.

6. The reverse staggered amorphous-silicon thin film transistor array substrate of claim 4 wherein said auxiliary source wirings are wider than said transparent source wirings.

7. The reverse staggered amorphous-silicon thin film transistor array substrate of claim 4 wherein said auxiliary source wirings are narrower than said transparent source wirings.

* * * * *